US008581889B2

(12) United States Patent
Taneda et al.

(10) Patent No.: US 8,581,889 B2
(45) Date of Patent: Nov. 12, 2013

(54) DISPLAY UNIT

(75) Inventors: Takayuki Taneda, Aichi (JP); Tetsuro Yamamoto, Kanagawa (JP); Katsuhide Uchino, Kanagawa (JP); Yuki Seo, Kanagawa (JP)

(73) Assignee: Sony Corporation (JP)

( * ) Notice: Subject to any disclaimer, the term of this patent is extended or adjusted under 35 U.S.C. 154(b) by 260 days.

(21) Appl. No.: 12/660,319

(22) Filed: Feb. 24, 2010

(65) Prior Publication Data
US 2010/0271347 A1 Oct. 28, 2010

(30) Foreign Application Priority Data

Mar. 6, 2009 (JP) ................. P2009-053159

(51) Int. Cl.
*G06F 3/038* (2013.01)

(52) U.S. Cl.
USPC ............. 345/205; 345/204; 345/55; 345/76

(58) Field of Classification Search
None
See application file for complete search history.

(56) References Cited

U.S. PATENT DOCUMENTS

| | | | |
|---|---|---|---|
| 6,777,888 B2* | 8/2004 | Kondo | 315/169.3 |
| 7,365,495 B2* | 4/2008 | Park et al. | 345/76 |
| 8,094,110 B2* | 1/2012 | Omata et al. | 345/90 |
| 2003/0016190 A1* | 1/2003 | Kondo | 345/55 |
| 2004/0207583 A1* | 10/2004 | Koo et al. | 345/82 |
| 2007/0002509 A1* | 1/2007 | Kumagai et al. | 361/56 |
| 2007/0075940 A1* | 4/2007 | Nakamura | 345/77 |
| 2008/0024402 A1* | 1/2008 | Nishikawa et al. | 345/82 |
| 2008/0122757 A1* | 5/2008 | Omata et al. | 345/76 |
| 2009/0115709 A1* | 5/2009 | Yamashita et al. | 345/76 |
| 2010/0141616 A1* | 6/2010 | Tanaka et al. | 345/205 |

FOREIGN PATENT DOCUMENTS

| | | |
|---|---|---|
| CN | 1815536 A | 8/2006 |
| JP | 2004191627 A | 7/2004 |
| JP | 2006011059 A | 1/2006 |
| JP | 2008039843 A | 2/2008 |
| JP | 2008-083272 A | 4/2008 |
| JP | 2008111184 A | 5/2008 |

OTHER PUBLICATIONS

Office Action from Japanese Application No. 2009-053159, dated Aug. 21, 2012.
Office Action from China Application No. 201010124956.4, dated Aug. 2, 2013.
Office Action from Japanese Application No. 2009-053159, dated Apr. 30, 2013.

* cited by examiner

*Primary Examiner* — Thuy Pardo
(74) *Attorney, Agent, or Firm* — Lerner, David, Littenberg, Krumholz & Mentlik LLP

(57) ABSTRACT

A display unit with which diffraction reflection is able to be decreased is provided. The display unit includes a display section having an organic EL device and a pixel circuit for every pixel. The pixel circuit has a first transistor for writing a video signal and a second transistor for driving the organic EL device based on the video signal written by the first transistor. The second transistor has a gate, a source and a drain. The organic EL device has an anode, an organic layer, and a cathode. An upper face of the source or the drain is formed at least in a region opposed to the anode or the cathode.

4 Claims, 14 Drawing Sheets

US 8,581,889 B2

DISPLAY UNIT

CROSS-REFERENCE TO RELATED APPLICATION

The present application claims priority from Japanese Patent Application No. JP 2009-053159 filed in the Japanese Patent Office on Mar. 6, 2009, the entire content of which is incorporated herein by reference.

BACKGROUND OF THE INVENTION

1. Field of the Invention

The present invention relates to a display unit including an organic EL (electro luminescence) device.

2. Description of the Related Art

In recent years, in the field of display units for displaying images, display units including as a light emitting device of a pixel, a current drive type optical device with the emission luminance changeable according to the flowing current value such as an organic EL device have been developed, and such display units are facilitated to be commercialized (for example, see Japanese Unexamined Patent Application Publication No. 2008-083272).

The organic EL device is a self-luminous emitting device differently from a liquid crystal device or the like. Thus, a display unit (organic EL display unit) including the organic EL device does not need a light source (backlight). Accordingly, in the organic EL display unit, compared to a liquid crystal display unit necessary for a light source, the image visibility is high, the electric power consumption is low, and the device response speed is high.

Drive systems in the organic EL display unit include simple (passive) matrix system and active matrix system as in the liquid crystal display unit. The former system has a disadvantage that it is difficult to realize a large and high definition display unit, though its structure is simple. Thus, currently, the active matrix system has been actively developed. In such a system, a current flowing through a light emitting device arranged for every pixel is controlled by an active device provided in a drive circuit provided for every light emitting device (in general, TFT (Thin Film Transistor)).

FIG. 14 illustrates a schematic configuration of a general organic EL display unit. A display unit 100 illustrated in FIG. 14 includes a display section 110 in which a plurality of pixels are arranged in a matrix state and a drive section for driving each pixel 120 (a horizontal drive circuit 130, a write scanning circuit 140, and a power source scanning circuit 150).

Each pixel 120 is composed of a red-use pixel 120R, a green-use pixel 120G, and a blue-use pixel 120B. As illustrated in FIG. 15 and FIG. 16, the pixels 120R, 120G, and 120B are composed of an organic EL device 121 (organic EL devices 121R, 121G, and 121B) and a pixel circuit 122 connected thereto. FIG. 15 illustrates a circuit configuration of the pixels 120R, 120G, and 120B. FIG. 16 illustrates a layout of the pixels 120R, 120G, and 120B.

The pixel circuit 122 is composed of a sampling-use transistor $T_{ws}$, a retentive capacity $C_s$, and a drive-use transistor $T_{Dr}$, and has a circuit configuration of 2Tr1C. A gate line WSL drawn from the write scanning circuit 140 is extended in the row direction, and is connected to a gate 123A of the transistor $T_{ws}$ through a contact 126A.

A drain line DSL drawn from the power source scanning circuit 150 is also extended in the row direction, and is connected to a drain 124C of the transistor $T_{Dr}$ through a leading wiring 128A. Further, a signal line DTL drawn from the horizontal drive circuit 130 is extended in the column direction, and is connected to a drain 123C of the transistor $T_{ws}$ through a contact 126B and a leading wiring 128B. A source 123B of the transistor $T_{ws}$ is connected to a gate 124A of the drive-use transistor $T_{Dr}$ and an end of the retentive capacity $C_s$ (terminal 125A) through a contact 126C. A source 124B of the transistor $T_{Dr}$ and the other end of the retentive capacity $C_s$ (terminal 125B) are connected to an anode 127A of the organic EL devices 121R, 121G, and 121B (hereinafter referred to as organic EL device 121R and the like) through a contact 126D. A cathode 127B of the organic EL device 121R and the like is connected to a ground line GND.

SUMMARY OF THE INVENTION

FIG. 17 illustrates a cross sectional configuration taken along line A-A of FIG. 16. In the section corresponding to the line A-A of FIG. 16, each pixel 120 has the gate 124A (terminal 125A), a gate insulating film 112, the source 124B (terminal 125B), an insulating protective film 113, an insulating planarizing film 114, an aperture defining insulating film 115, the organic EL device 121, and an insulating protective film 116 over the substrate 111. Directly under the anode 127A of the organic EL device 121R and the like, for example, the source 124B (terminal 125B) having a film thickness of about 1 µm exists. To prevent generation of concavity and convexity in the anode 127A due to the source 124B (terminal 125B), the insulating planarizing film 114 is formed.

However, in practice, as illustrated in FIG. 17, for example, concavity and convexity 127D being about from 0.3 µm to 0.4 µm sized is generated in the anode 127A due to the source 124B (terminal 125B). The concavity and convexity 127D reflects the shape of the source 124B (terminal 125B), and is extended long in the column direction. Thus, in the case where outside light L enters the anode 127A, the light is diffraction-reflected by the concavity and convexity 127D. Accordingly, there is a disadvantage that the reflected light is viewed by an observer (not illustrated), and image quality is lowered.

In view of the foregoing, in the invention, it is desirable to provide a display unit with which diffraction reflection is able to be decreased.

According to an embodiment of the invention, there is provided a first display unit including a display section having an organic EL device and a pixel circuit for every pixel. The pixel circuit has a writing-use first transistor for writing a video signal and a drive-use second transistor for driving the organic EL device based on the video signal written by the first transistor. The second transistor has a gate, a source, and a drain. The organic EL device has an anode, an organic layer, and a cathode. An upper face of the source or the drain is formed at least in a region opposed to the anode or the cathode.

In the first display unit of the embodiment of the invention, the upper face of the source or the drain of the second transistor is formed at least in the region opposed to the anode or the cathode of the organic EL device. Thereby, a step corresponding to the end of the source or the drain does not exist directly under the anode or the cathode, and the anode or the cathode is formed on a flat face.

According to an embodiment of the invention, there is provided a second display unit including a display section having an organic EL device and a pixel circuit for every pixel. The pixel circuit has a writing-use first transistor for writing a video signal and a drive-use second transistor for driving the organic EL device based on the video signal written by the first transistor. The second transistor has a gate, a source, and a drain. The organic EL device has an anode, an organic layer, and a cathode. The source or the drain has a long side portion including a continuous curved face.

In the second display unit of the embodiment of the invention, the source or the drain of the second transistor has a long side portion including a continuous curved face. Thereby, in the anode or the cathode of the organic EL device, concavity and convexity corresponding to the continuous curved face formed in the long side portion of the source or the drain is formed.

In the first and the second display units of the embodiment of the invention, the display section may have a retentive capacity connected between the gate and the source or the drain for every pixel. In this case, the retentive capacity is able to be composed of one of the source and the drain in which the upper face of the source or the drain is formed at least in the region opposed to the anode or the cathode and the gate.

According to the first display unit of the embodiment of the invention, the upper face of the source or the drain of the second transistor is formed at least in a region opposed to the anode or the cathode of the organic EL device. Thereby, when outside light enters the anode or the cathode, diffraction reflection is able to be decreased. In the result, lowering of image quality caused by diffraction reflection is able to be suppressed.

According to the second display unit of the embodiment of the invention, the long side portion including the continuous curved face is provided in the source or the drain of the second transistor. Thereby, when outside light enters the anode or the cathode, generation of diffraction reflection in a certain direction is able to be decreased. In the result, lowering of image quality caused by diffraction reflection is able to be suppressed.

Other and further objects, features and advantages of the invention will appear more fully from the following description.

DETAILED DESCRIPTION OF THE PREFERRED EMBODIMENTS

Figure 1:
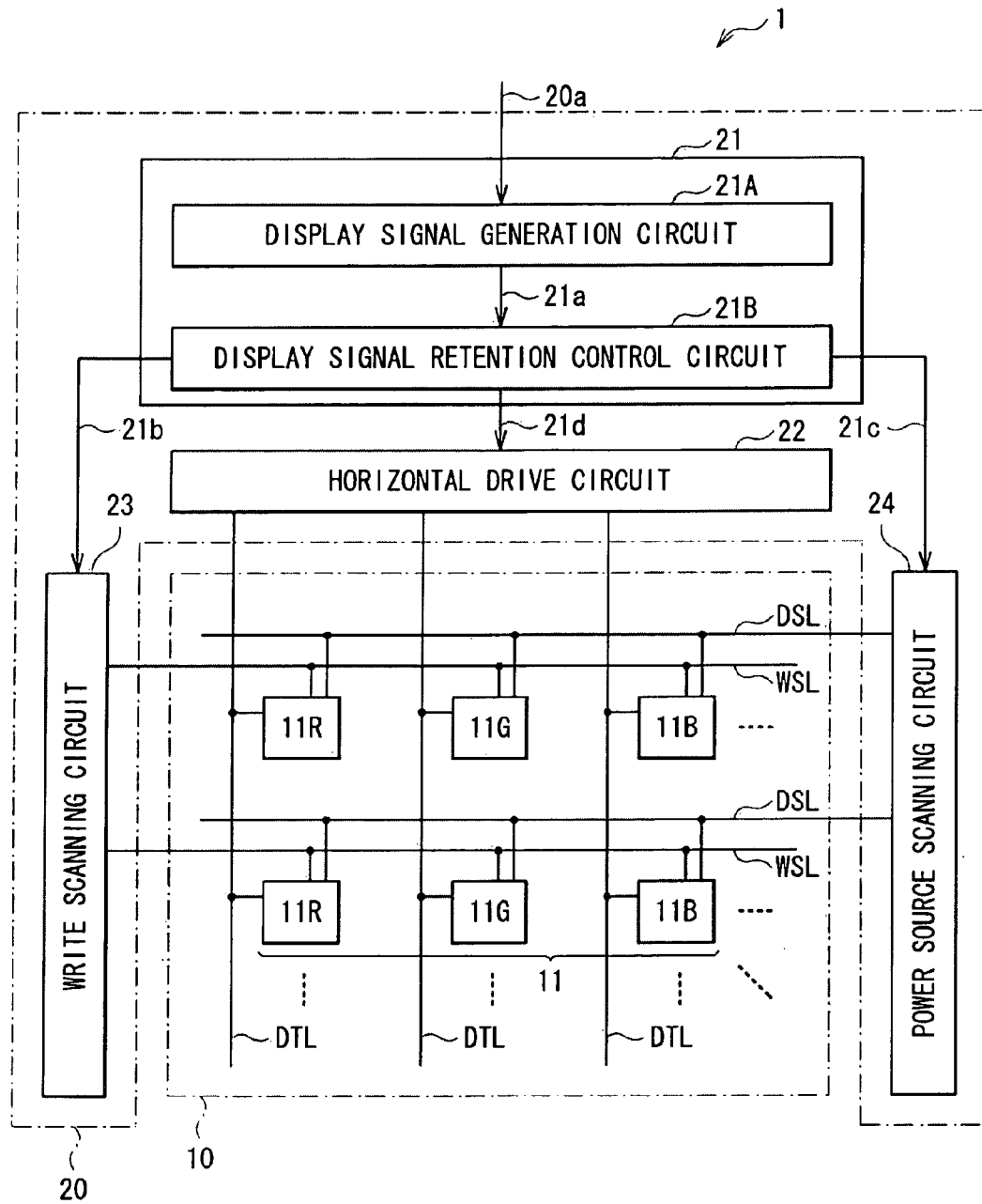
FIG. 1 is a schematic configuration view of a display unit according to a first embodiment of the invention.

Embodiments of the invention will be hereinafter described in detail with reference to the drawings. The description will be given in the following order:
1. First embodiment (source area is large)
2. Modified example
3. Second embodiment (including a continuous curved face in an end of a cathode)
4. Modified example
5. Module and application examples First Embodiment FIG. 1 illustrates an example of a whole configuration of a display unit 1 according to a first embodiment of the invention. The display unit 1 includes a display section 10 and a peripheral circuit section 20 (drive section) formed on the periphery of the display section 10 on a substrate 40 (described later) made of, for example, glass, a silicon (Si) wafer, a resin or the like.

Display Section 10

In the display section 10, a plurality of pixels 11 are arranged in a matrix state over the whole area of the display section 10. The display section 10 displays an image based on a video signal 20*a* inputted from outside by active matrix drive. Each pixel 11 includes a red-use pixel 11R, a green-use pixel 11G, and a blue-use pixel 11B.

Figure 2:
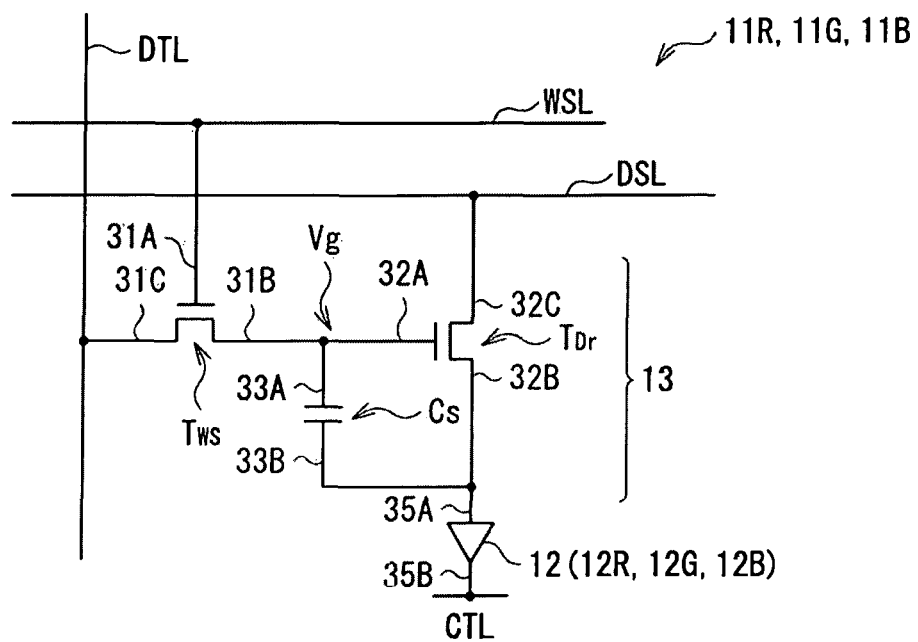
FIG. 2 is a circuit configuration diagram of the pixel of FIG. 1.
Figure 3:
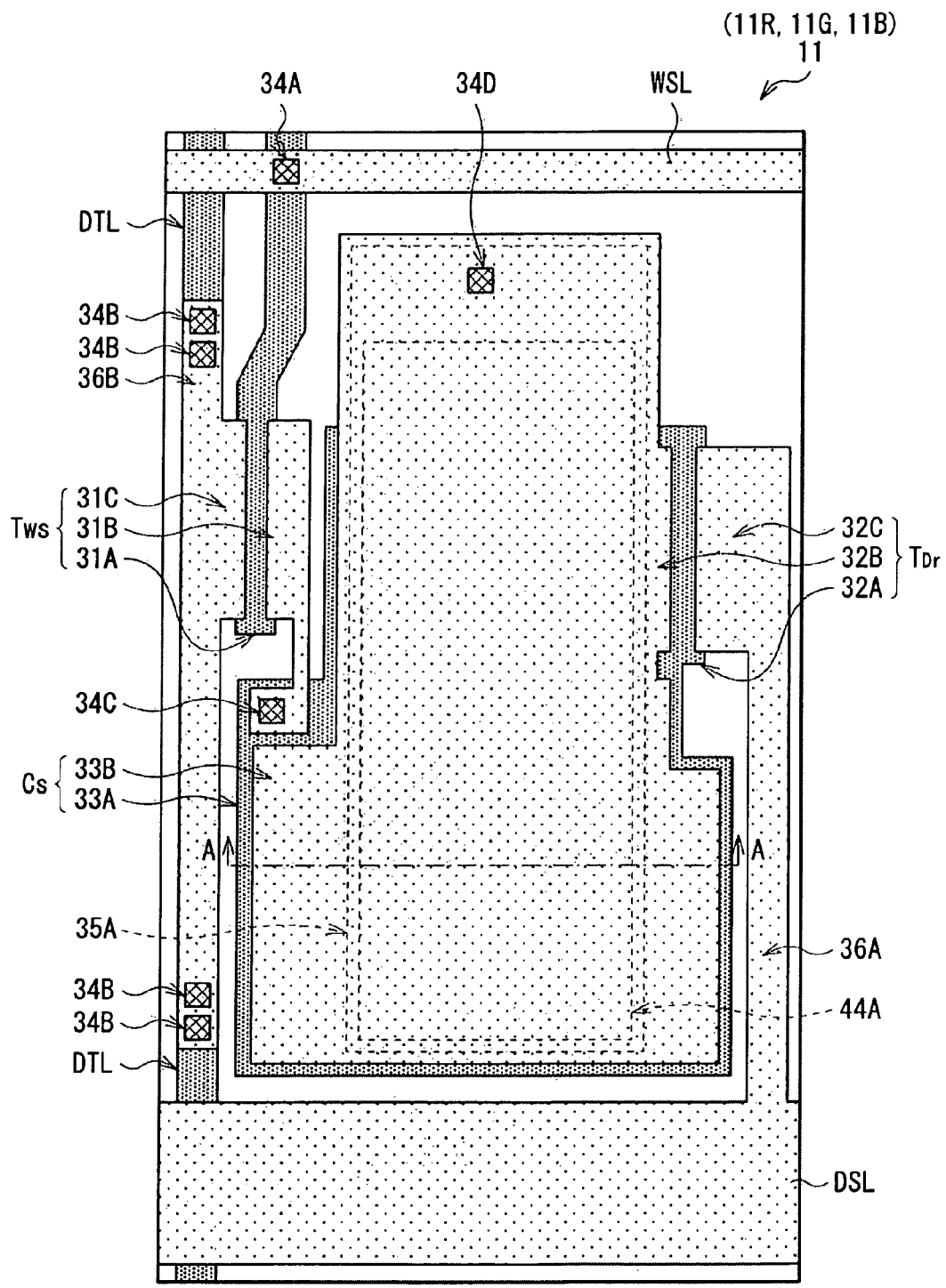
FIG. 3 is a layout diagram of the pixel of FIG. 1.

FIG. 2 illustrates an example of a circuit configuration of the pixels 11R, 11G, and 11B. FIG. 3 illustrates a layout of the pixels 11R, 11G, and 11B. In the pixels 11R, 11G, and 11B, as illustrated in FIG. 2, organic EL devices 12R, 12G, and 12B (light emitting devices) and a pixel circuit 13 are provided.

The pixel circuit 13 is composed of a transistor Tws (first transistor), a transistor TDr (second transistor), and a retentive capacity Cs connected between a gate and a source of the transistor TDr, and has a circuit configuration of 2Tr1C. The transistor Tws is a writing-use transistor for writing a video signal. The transistor TDr is a drive-use transistor for driving the organic EL devices 12R, 12G, and 12B (hereinafter generically referred to as organic EL devices 12) based on the video signal written by the transistor Tws. The transistors Tws and TDr are formed from, for example, an n channel MOS type thin film transistor (TFT).

Peripheral Circuit Section 20

The peripheral circuit section 20 has a timing control circuit 21, a horizontal drive circuit 22, a write scanning circuit 23, and a power source scanning circuit 24. The timing control circuit 21 includes a display signal generation circuit 21A and a display signal retention control circuit 21B. Further, in the peripheral circuit section 20, a gate line WSL, a drain line DSL, a signal line DTL, and a ground line GND are provided. The ground line is intended to be connected to the ground, and a ground voltage (reference voltage) is obtained when the ground line is connected to the ground.

The display signal generation circuit 21A is intended to generate a display signal 21a for performing display on the display section 10, for example, for every 1 screen (for every 1 field display) based on a video signal 20a inputted from outside.

The display signal retention control circuit 21B is intended to store and retain the display signal 21a outputted from the display signal generation circuit 21A for every 1 screen (for every 1 field display) into a field memory composed of, for example, an SRAM (Static Random Access Memory). The display signal retention control circuit 21B further plays a role to control so that the horizontal drive circuit 22, the write scanning circuit 23, and the power source scanning circuit 24 for driving each pixel 11 are operated simultaneously with each other. Specifically, the display signal retention control circuit 21B outputs a control signal 21b to the write scanning circuit 23, outputs a control signal 21c to the power source scanning circuit 24, and outputs a control signal 21d to the display signal drive circuit 21C, respectively.

The horizontal drive circuit 22 is able to output a voltage according to the control signal 21d outputted from the display signal retention control circuit 21B. Specifically, the horizontal drive circuit 22 is intended to supply a given voltage to the pixel 11 selected by the write scanning circuit 23 through the signal line DTL connected to each pixel 11 of the display section 10.

The write scanning circuit 23 is able to output a voltage according to the control signal 21b outputted from the display signal retention control circuit 21B. Specifically, the write scanning circuit 23 is intended to supply a given voltage to the pixel 11 as a drive target through the gate line WSL connected to each pixel 11 of the display section 10 to control the sampling-use transistor Tws.

The power source scanning circuit 24 is able to output a voltage according to the control signal 21c outputted from the display signal retention control circuit 21B. Specifically, the power source scanning circuit 24 is intended to supply a given voltage to the pixel 11 as a drive target through the drain line DSL connected to each pixel 11 of the display section 10 to control emitting and extinguishing light of the organic EL device 12R and the like.

Layout

Next, a description will be given of a connection relation of each element with reference to FIG. 2 and FIG. 3. The gate line WSL drawn from the write scanning circuit 23 is extended in the row direction, and is connected to a gate 31A of the transistor $T_{ws}$ through a contact 34A. The drain line DSL drawn from the power source scanning circuit 24 is also extended in the row direction, and is connected to a drain 32C of the transistor $T_{Dr}$ through a leading wiring 36A. Further, the signal line DTL drawn from the horizontal drive circuit 22 is extended in the column direction, and is connected to a drain 31C of the transistor $T_{ws}$ through a contact 34B and a leading wiring 36B. A source 31B of the transistor $T_{ws}$ is connected to a gate 32A of the drive-use transistor $T_{Dr}$ and an end of the retentive capacity $C_s$ (terminal 33A). A source 32B of the transistor $T_{Dr}$ and the other end of the retentive capacity $C_s$ (terminal 33B) are connected to an anode 35A of the organic EL device 12 through a contact 34D. A cathode 35B of the organic EL device 12 is connected to the ground line GND.

Cross Sectional Configuration

Figure 4:
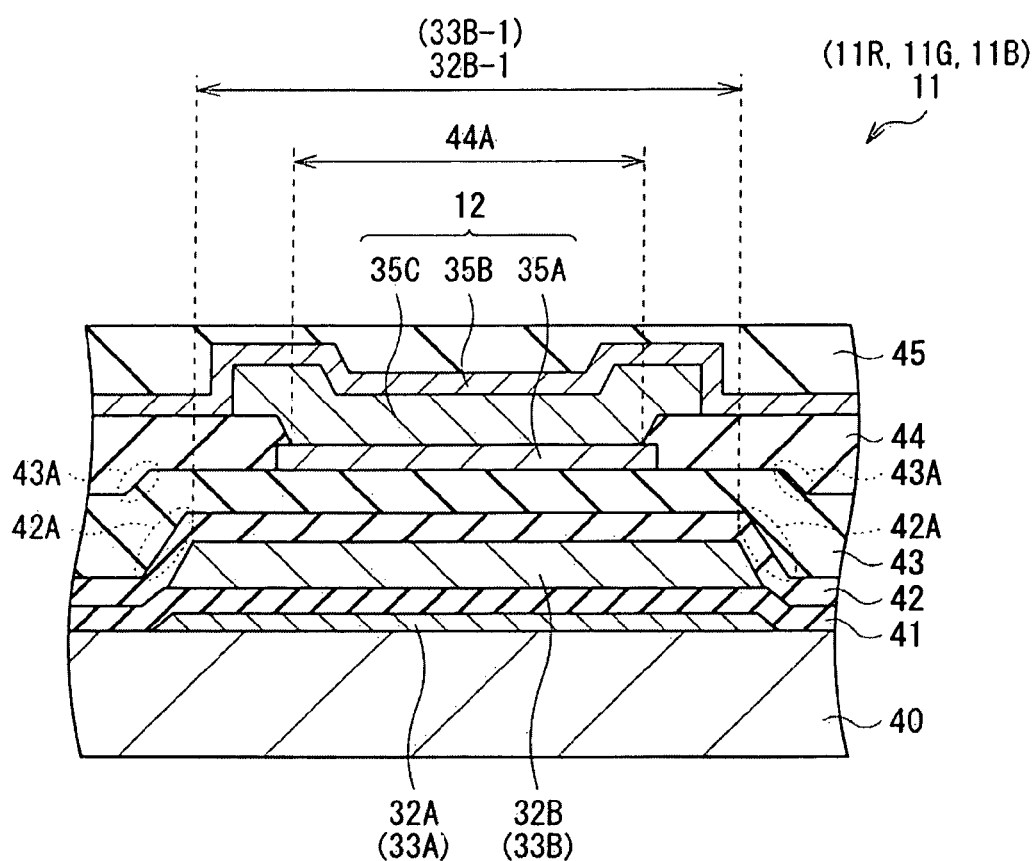
FIG. 4 is a cross sectional view of the pixel of FIG. 3.

FIG. 4 illustrates a cross sectional configuration taken along line A-A of FIG. 3. In the section corresponding to the line A-A of FIG. 3, each pixel 11 has the gate 32A (terminal 33A), a gate insulating film 41, the source 32B (terminal 33B), an insulating protective film 42, an insulating planarizing film 43, the organic EL device 12, an aperture defining insulating film 44, and an insulating protective film 45 over the substrate 40.

The gate 32A (terminal 33A) is formed on the surface of the substrate 40, and is formed generally in a region including a region opposed to an EL aperture 44A described later. FIG. 3 exemplifies a case that the gate 32A (terminal 33A) is formed in a region including a region opposed to a region excluding the upper portion of the EL aperture 44A. The gate insulating film 41 covers the whole surface of the substrate 40 including the gate 32A (terminal 33A). Since the gate 32A is extremely thin, concavity and convexity due to the gate 32A does not actually exist in the gate insulating film 41. That is, the upper face of the gate insulating film 41 is optically equal to a flat face.

The source 32B (terminal 33B) is formed between the gate insulating film 41 and the insulating protective film 42. An upper face 32B-1 of the source 32B (upper face 33B-1 of the terminal 33B) is a flat face, and is formed at least in a region opposed to the anode 35A. As will be described later, part of the upper face of the anode 35A corresponds to the EL aperture 44A. Thus, the upper face 32B-1 (33B-1) is formed in a region including a region opposed to the EL aperture 44A.

The insulating protective film 42 covers the whole surface of the gate insulating film 41 and the source 32B (terminal 33B). Since the insulating protective film 42 is formed along the surface of the gate insulating film 41 and the source 32B (terminal 33B), the insulating protective film 42 has a step 42A corresponding to the end of the source 32B (terminal 33B). The step 42A is formed in a region not opposed to the anode 35A. In the upper face of the insulating protective film 42, at least a region opposed to the anode 35A is a flat face.

The insulating planarizing film 43 is provided to planarize a base of the source 32B (terminal 33B), and covers the whole surface of the insulating protective film 42. The insulating planarizing film 43 has, for example, a step 43A having a height of about half or less than a height of the step 42A in a region corresponding to the step 42A. The step 43A is formed in a region not opposed to the anode 35A. In the upper face of the insulating planarizing film 43, at least a region opposed to the anode 35A is a flat face.

The organic EL device 12 has a structure in which, for example, the anode 35A, an organic layer 35C, and the cathode 35B are sequentially layered from the substrate 40 side. The organic layer 35C has a laminated structure in which a hole injection layer for improving efficiency of hole injection, a hole transport layer for improving efficiency of hole transport to the light emitting layer, a light emitting layer for generating light emission by electron-hole recombination, and an electron transport layer for improving efficiency of electron transport to the light emitting layer are layered sequentially from the anode 35A side. The anode 35A is formed on a surface (flat face) of a portion surrounded by the step 43A in the insulating planarizing film 43. Thus, in the anode 35A, concavity and convexity corresponding to the steps 42A and 43A does not exist, and the anode 35A is a flat film along the flat face of the insulating planarizing film 43. The cathode 35B is formed at least on the upper face of the organic layer 35C. For example, the cathode 35B covers the whole surface of the organic layer 35C and the aperture defining insulating film 44.

The aperture defining insulating film 44 is formed in the same plane as that of the anode 35A of the organic EL device 12, and has an aperture (EL aperture 44A) corresponding to the anode 35A. The EL aperture 44A is formed in part of a region opposed to the upper face of the anode 35A, and the aperture defining insulating film 44 covers the outer edge (peripheral edge) of the anode 35A. That is, on the bottom face of the EL aperture 44A, only part of the upper face of the anode 35A is exposed. The organic layer 35C is contacted with the exposed portion on the bottom face of the EL aperture 44A in the upper face of the anode 35A.

The insulating protective film 45 covers the whole surface of the cathode 35B. The insulating protective film 45 is formed from a material transparent to light emitted in the organic EL device 12. Thus, the insulating protective film 45 is able to pass not only the emitted light of the organic EL device 12 but also outside light in the same waveband as that of the emitted light of the organic EL device 12.

Operation and Effect

In the display unit 1 of this embodiment, the pixel circuit 13 is on/off controlled in each pixel 11, and a drive current is injected to the organic EL device 12 of each pixel 11. Thereby, electron-hole recombination is generated to initiate light emission. The light is reflected in a multiple fashion between the anode 35A and the cathode 35B, is transmitted through the cathode 35B, and is extracted outside. In the result, an image is displayed in the display section 10.

Figure 17:
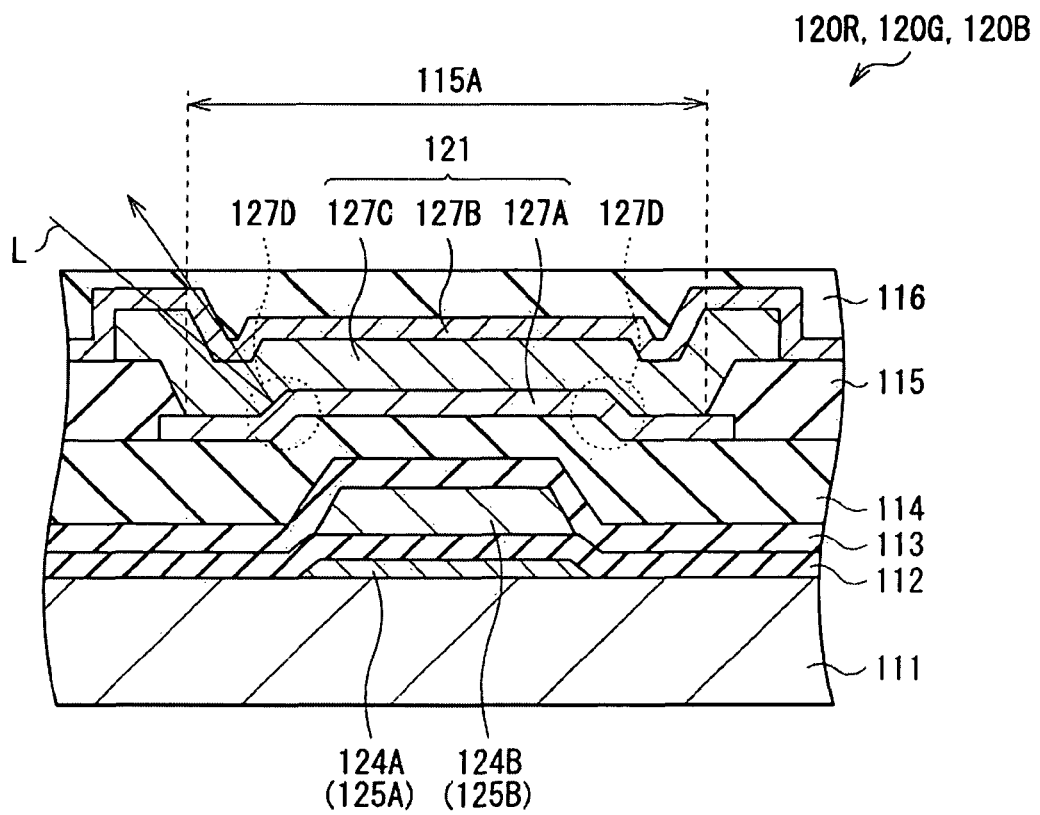
FIG. 17 is a cross sectional view of the pixel of FIG. 16.

In the existing display unit, for example, as illustrated in FIG. 17, the source 124B (terminal 125B) having a film thickness of about 1 µm exists directly under the anode 127A of the organic EL device 121R and the like, for example. It results in generation of the concavity and convexity 127D being about from 0.3 µm to 0.4 µm sized in the anode 127A. The concavity and convexity 127D reflects the shape of the source 124B (terminal 125B), and is extended long in the column direction. Thus, in the case where the outside light L enters the anode 127A, the light is diffraction-reflected by the concavity and convexity 127D. In the result, there is a disadvantage that, for example, the reflected light is viewed by an observer (not illustrated), and image quality is lowered.

Meanwhile, in this embodiment, as in the existing example, the source 32B (terminal 33B) having a film thickness of about 1 µm exists directly under the anode 35A of the organic EL device 12. However, in this embodiment, the upper face 32B-1 of the source 32B (the upper face 33B-1 of the terminal 33B) is formed at least in the region opposed to the anode 35A. Thus, the steps 42A and 43A formed in the insulating protective film 42 and the insulating planarizing film 43 correspondingly to the end of the source 32B (terminal 33B) do not exist directly under the anode 35A, and the anode 35A is formed on the flat face of the insulating planarizing film 43. That is, in the anode 35A, concavity and convexity corresponding to the steps 42A and 43A does not exist, and the anode 35A is the flat film along the flat face of the insulating planarizing film 43. Thus, in the case where the outside light L enters the anode 35A, diffraction reflection as in the existing case is not generated. Accordingly, there is no possibility that image quality is lowered due to diffraction reflection.

Modified Example

Figure 5:
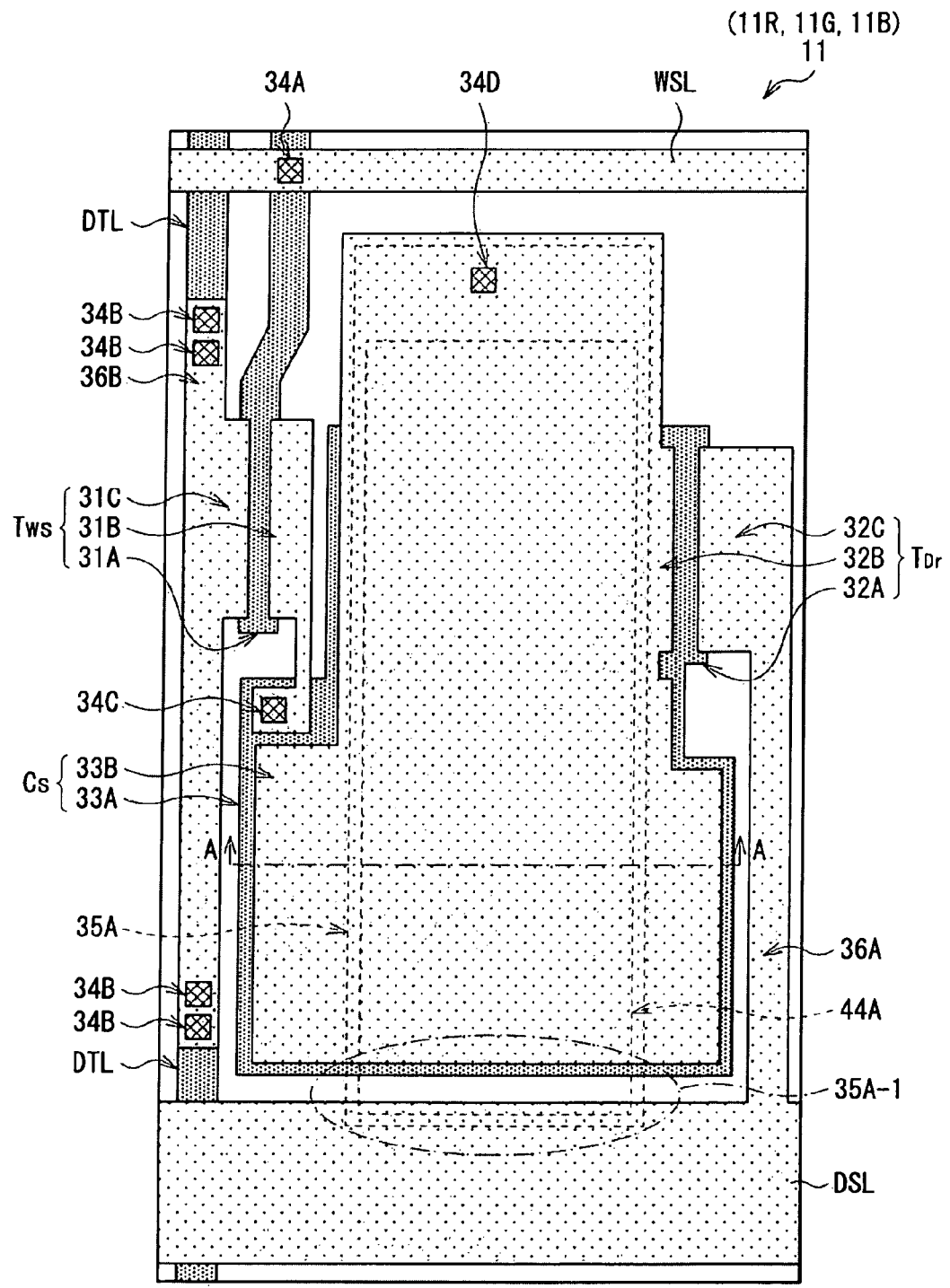
FIG. 5 is a layout diagram of a modified example of the pixel of FIG. 1.

In the foregoing embodiment, the case that the upper face 32B-1 (33B-1) is formed at least in the region opposed to the anode 35A has been exemplified. However, it is possible that formation position of the upper face 32B-1 (33B-1) is shifted from the region opposed to the anode 35A in a range in which diffraction reflection is able to be decreased than in the existing example. For example, as illustrated in FIG. 5, it is possible that formation position of the upper face 32B-1 (33B-1) is shifted upward in the figure with respect to the anode 35A, and is not opposed to only a short side portion 35A-1 (short side and a portion in the vicinity thereof) of the anode 35A. In the case of FIG. 5, aside in the longitudinal direction of the anode 35A and a portion in the vicinity thereof are opposed to the upper face 32B-1 (33B-1), and at least diffraction reflection is not generated. Thus, diffraction reflection is able to be decreased than in the existing example. In the result, lowering of image quality due to diffraction reflection is able to be suppressed. Further, though not illustrated, only when concavity and convexity generated in the anode 35A is extremely small such as about 0.1 µm, the end of the upper face 32B-1 (33B-1) may be located slightly inside of the end of the anode 35A.

Second Embodiment

Figure 6:
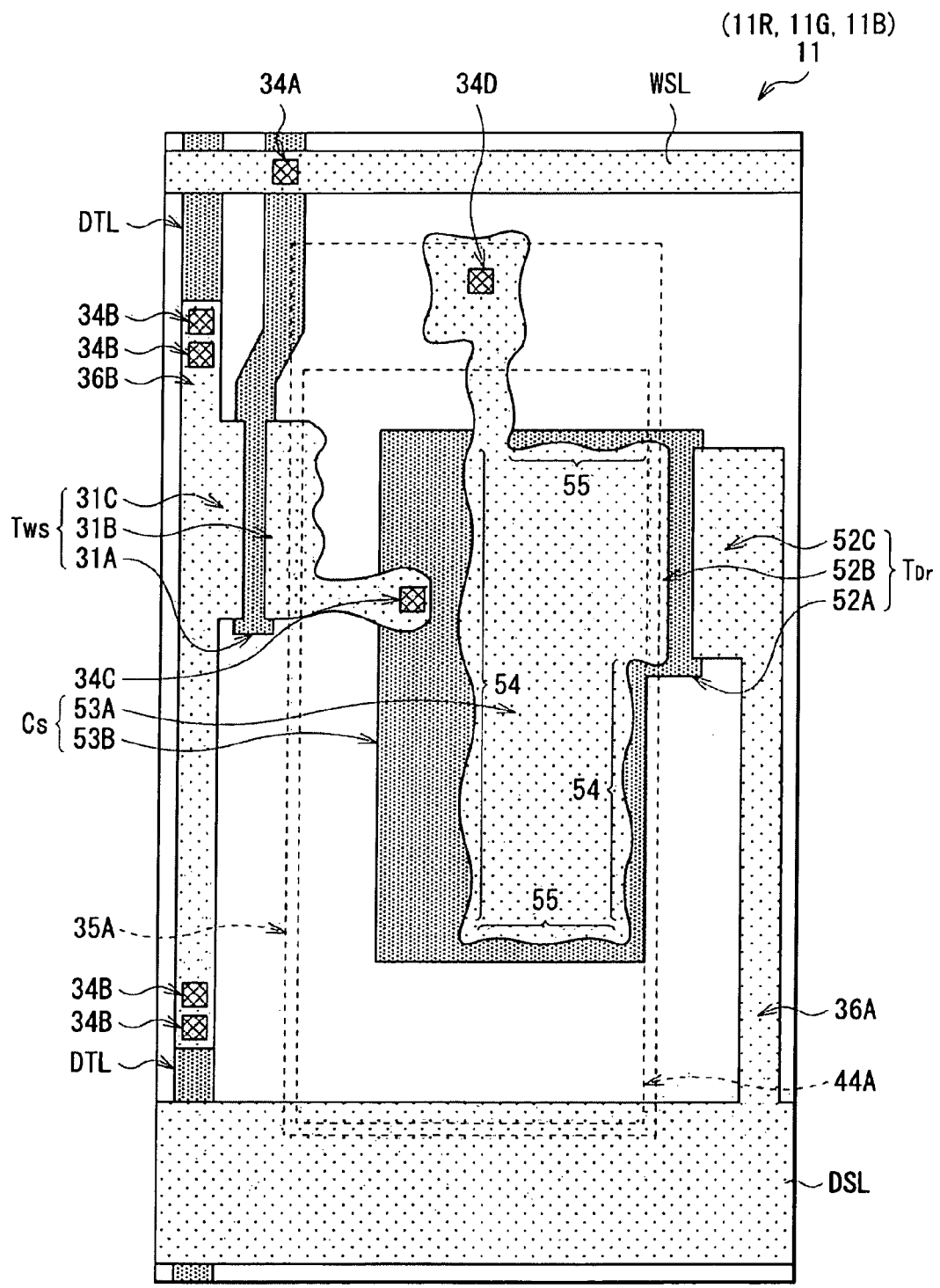
FIG. 6 is a layout diagram of a pixel included in a display unit according to a second embodiment of the invention.

FIG. 6 illustrates a layout of the pixel 11 (11R, 11G, and 11B) of a display unit according to a second embodiment of the invention. The configuration of the display unit of this embodiment is different from the configuration of the display unit 1 of the foregoing embodiment and the modified example thereof in that agate 52A is included instead of the gate 32A of the transistor $T_{Dr}$ and a source 52B is included instead of the source 32B of the transistor $T_{Dr}$. Further, the configuration of the display unit of this embodiment is different from the configuration of the display unit 1 of the foregoing embodiment and the modified example thereof in that a terminal 53A is included instead of the terminal 33A of the retentive capacity $C_s$ and a terminal 53B is included instead of the terminal 33B of the retentive capacity $C_s$, respectively. Thus, a description will be hereinafter mainly given of different points from the foregoing embodiment and the modified example thereof, and a description of the same points as those of the foregoing embodiment and the modified example thereof will be omitted as appropriate.

Layout

Figure 16:
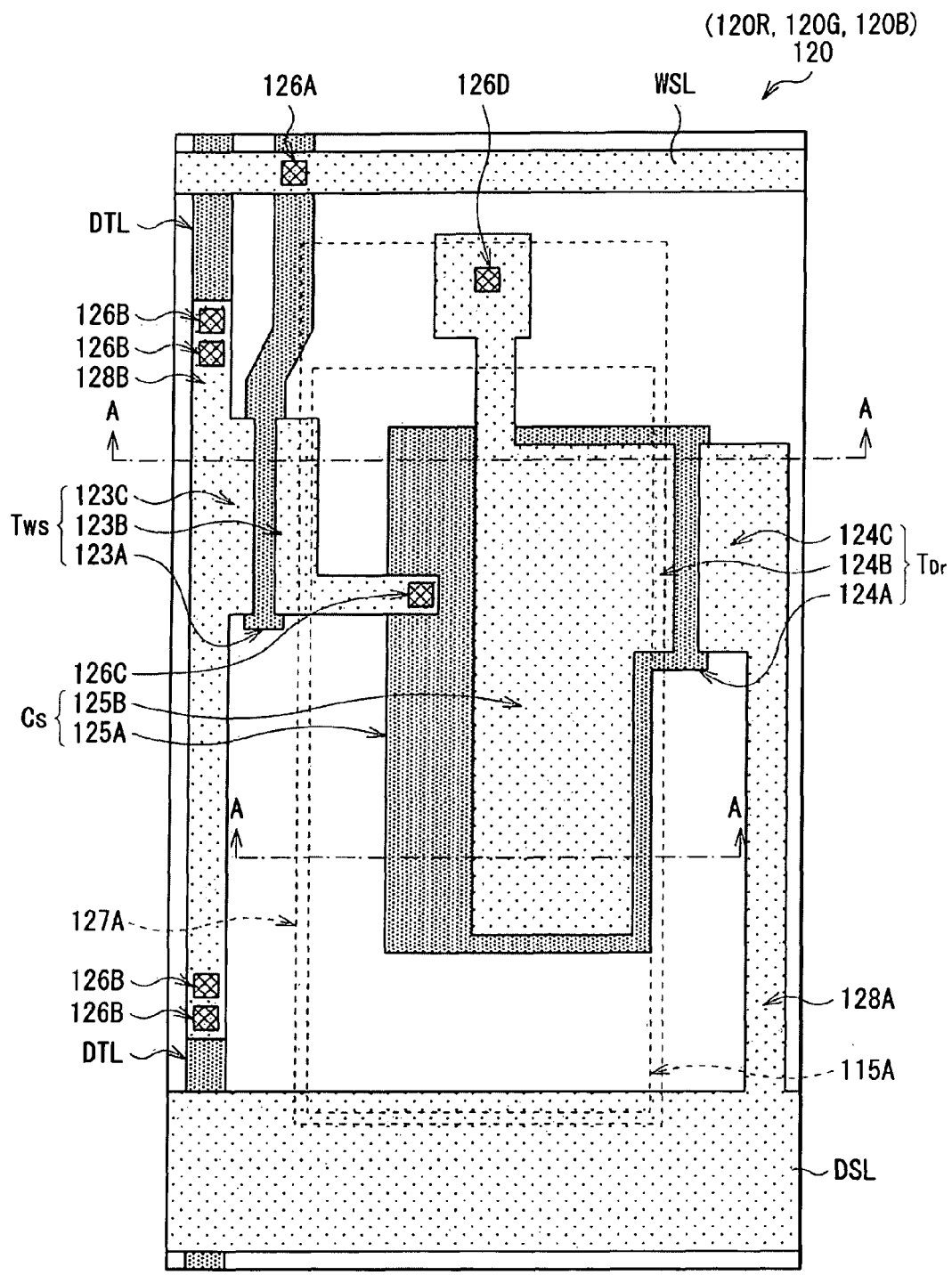
FIG. 16 is a layout diagram of the pixel of FIG. 14.

In this embodiment, the gate 52A (terminal 53A) has a smaller area than the area of the gate 32A (terminal 33A) of the foregoing embodiment. Except for a portion mainly functioning as the gate 32A of the transistor $T_{Dr}$, the gate 52A (terminal 53A) is within a region opposed to the anode 35A. That is, the gate 52A (terminal 53A) has a structure similar to that of the gate 124A (terminal 125A) of the existing example illustrated in FIG. 16.

Meanwhile, similarly, the source 52B (terminal 53B) has a smaller area than the area of the source 32B (terminal 33B) of the foregoing embodiment. Except for a portion mainly functioning as the source 52B of the transistor $T_{Dr}$, the source 52B (terminal 53B) is within a region opposed to the anode 35A. That is, in this light, the source 52B (terminal 53B) has a structure similar to that of the source 124B (terminal 125B) of the existing example illustrated in FIG. 16.

However, differently from the source 124B (terminal 125B) of the existing example, the source 52B (terminal 53B) is not straight but undulates in the in-plane direction at least in along side portion 54 (long side and a portion in the vicinity thereof) of the source 52B (terminal 53B). That is, the source 52B (terminal 53B) includes a continuous curved face at least in the long side portion 54 of the source 52B (terminal 53B). FIG. 6 exemplifies a case that the source 52B (terminal 53B) includes a continuous curved face not only in the long side portion 54 but also in the short side portion 55 (short side and a portion in the vicinity thereof). Further, FIG. 6 exemplifies a case that the source 31B of the transistor $T_{ws}$ formed in the same layer as that of the source 52B (terminal 53B) also includes a continuous curved face in the long side and a portion in the vicinity thereof.

Cross Sectional Configuration

Figure 7:
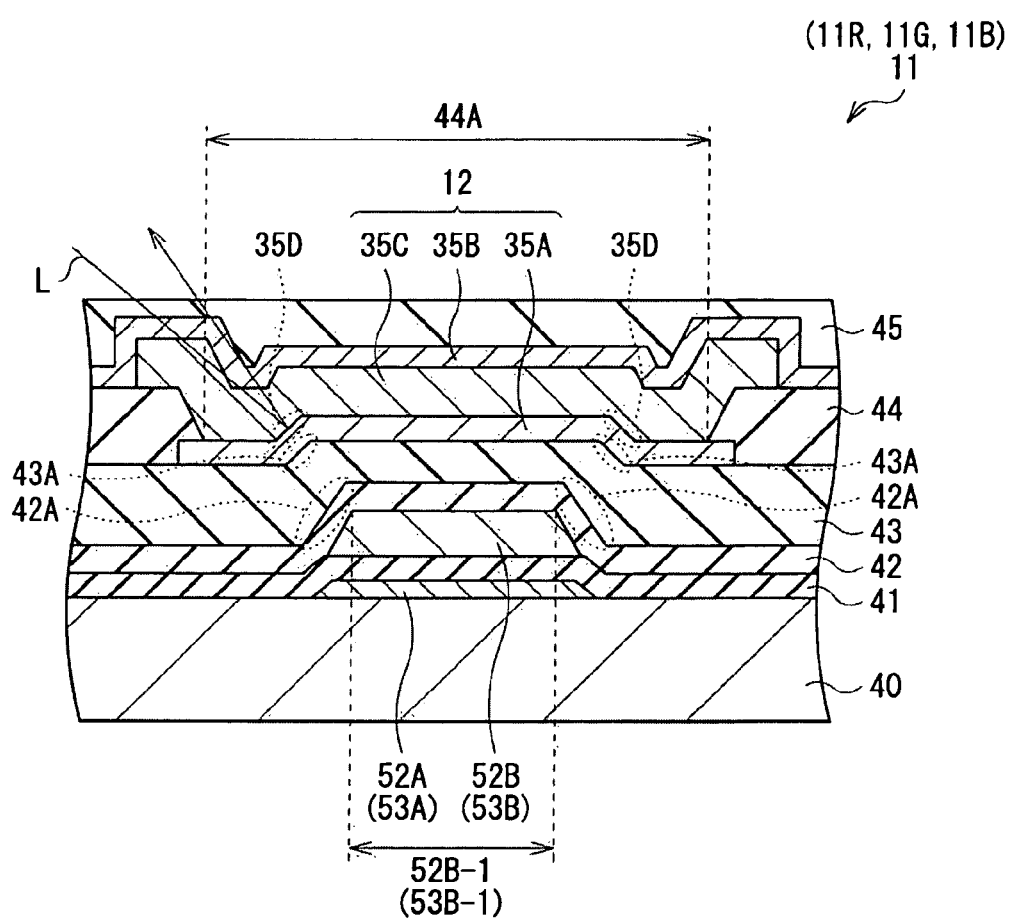
FIG. 7 is a cross sectional view of the pixel of FIG. 6.

FIG. 7 illustrates a cross sectional configuration taken along line A-A of FIG. 6. In the portion corresponding to the line A-A of FIG. 6, each pixel 11 has the gate 52A (terminal 53A), the gate insulating film 41, the source 52B (terminal 53B), the insulating protective film 42, the insulating planarizing film 43, the organic EL device 12, the aperture defining insulating film 44, and the insulating protective film 45 over the substrate 40.

The gate 52A (terminal 53A) is formed on the surface of the substrate 40, and as described above, is formed within the region opposed to the anode 35A except for a portion mainly functioning as the gate 32A of the transistor $T_{Dr}$. The gate insulating film 41 covers the whole surface of the substrate 40 including the gate 52A (terminal 53A). Since the gate 52A (terminal 53A) is extremely thin, concavity and convexity due to the gate 52A (terminal 53A) does not actually exist. That is, the upper face of the gate insulating film 41 is optically equal to a flat face.

The source 52B (terminal 53B) is formed between the gate insulating film 41 and the insulating protective film 42. An upper face 52B-1 of the source 52B (upper face 53B-1 of the terminal 53B) is a flat face, and is formed within the region opposed to the anode 35A except for the portion mainly functioning as the source 52B of the transistor $T_{Dr}$ as described above. Further, the upper face 52B-1 (53B-1) is formed within a region opposed to the EL aperture 44A except for the portion mainly functioning as the source 52B of the transistor $T_{Dr}$.

The insulating protective film 42 covers the whole surface of the gate insulating film 41 and the source 52B (terminal 53B). Since the insulating protective film 42 is formed along the surface of the gate insulating film 41 and the source 52B (terminal 53B), the insulating protective film 42 has the step 42A in a region corresponding to the end of the source 52B (terminal 53B). The step 42A undulates in the in-plane direction (includes a continuous curved face) as the end of the source 52B (terminal 53B) does. The step 42A is formed within a region opposed to the anode 35A and the EL aperture 44A. In the upper face of the insulating protective film 42, the region opposed to the anode 35A and the EL aperture 44A is a concavity and convexity face undulating in the in-plane direction.

The insulating planarizing film 43 is provided to planarize the base of the source 52B (terminal 53B), and covers the whole surface of the insulating protective film 42. The insulating planarizing film 43 has, for example, the step 43A having a height of about half or less than a height of the step 42A in a region corresponding to the step 42A. The step 43A undulates in the in-plane direction (includes a continuous curved face) as the step 42A does. The step 43A is formed within a region opposed to the anode 35A and the EL aperture 44A. In the upper face of the insulating planarizing film 43, at least the region opposed to the anode 35A and the EL aperture 44A is a concavity and convexity face undulating in the in-plane direction.

In the organic EL device 12, the anode 35A is formed on the surface including the step 43A of the insulating planarizing film (concavity and convexity face). Thus, in the anode 35A, concavity and convexity corresponding to the step 43A is formed, and has a step 35D along the concavity and convexity face of the insulating planarizing film 43. The step 35D undulates in the in-plane direction (includes a continuous curved face) as the step 43A does. The step 35D is exposed on the bottom face of the EL aperture 44A. Concavity and convexity corresponding to the step 35D is also formed in the organic layer 35C and the cathode 35B.

Effect

In the display unit of this embodiment, as in the existing example, the source 52B (terminal 53B) having a film thickness of about 1 μm exists directly under the anode 35A of the organic EL device 12. Further, as in the existing example, the upper face 52B-1 (53B-1) of the source 52B (terminal 53B) is formed within the region opposed to the EL aperture 44A except for the portion mainly functioning as the source 52B of the transistor $T_{Dr}$. However, in this embodiment, the source 52B (terminal 53B) includes the continuous curved face in the long side portion 54 of the source 52B (terminal 53B). Thus, in the anode 35A, the concavity and convexity corresponding to the continuous curved face formed in the long side portion 54 of the source 52B (terminal 53B) is formed. Further, in this embodiment, the source 52B (terminal 53B) also includes the continuous curved face in the short side portion 55 of the source 52B (terminal 53B). Thus, in the anode 35A, the concavity and convexity corresponding to the continuous curved face formed in the short side portion 55 of the source 52B (terminal 53B) is formed. Therefore, in the case where the outside light L enters the anode 35A, diffraction reflection is not generated in a certain direction. Accordingly, there is no possibility that image quality is lowered due to diffraction reflection.

Modified Example

In the foregoing embodiment, the case that the source 52B (terminal 53B) includes the continuous curved face in the long side portion 54 and the short side portion 55 is exemplified. However, the formation region of the continuous curved face may be decreased in a range in which diffraction reflection is able to be decreased than in the existing example. For example, though not illustrated, it is possible that the continuous curved face is provided only in the long side portion 54 of the source 52B (terminal 53B), such a continuous curved face is not provided in the short side portion 55 but a linear end face is provided in the short side portion 55. Thereby, generation of diffraction reflection in a certain direction is able to be decreased. In the result, lowering of image quality due to diffraction reflection is able to be suppressed.

Module and Application Examples

A description will be given of application examples of the display unit described in the foregoing embodiments and the modified examples thereof. The display unit of the foregoing embodiments and the like is applicable to a display unit of electronic devices in any field for displaying a video signal inputted from outside or a video signal generated inside as an image or a video such as a television device, a digital camera, a notebook personal computer, a portable terminal device such as a mobile phone, and a video camera.

Module

Figure 8:
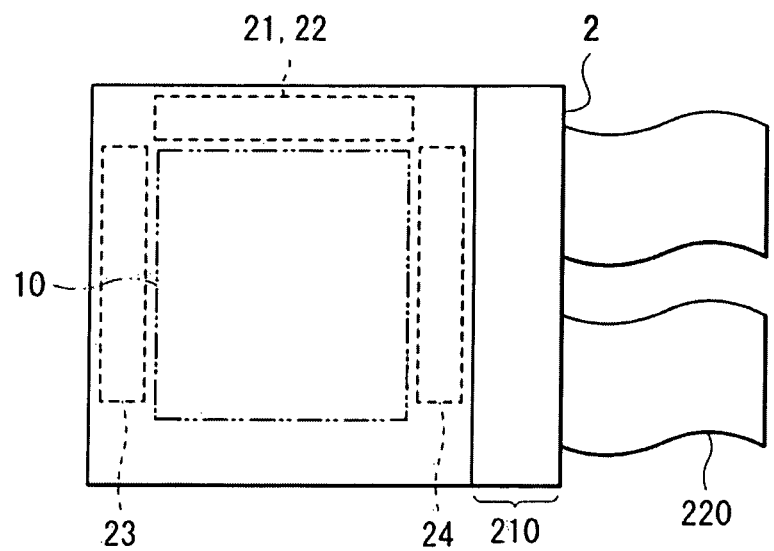
FIG. 8 is a plan view illustrating a schematic configuration of a module including the display unit of the foregoing respective embodiments.

The display unit of the foregoing embodiments and the like is incorporated in various electronic devices such as after-mentioned first to fifth application examples as a module as illustrated in FIG. 8, for example. In the module, for example, a region 210 exposed from a member (not illustrated) sealing the display section 10 is provided in a side of a substrate 2, and an external connection terminal (not illustrated) is formed in the exposed region 210 by extending wirings of the timing control circuit 21, the horizontal drive circuit 22, the write scanning circuit 23, and the power source scanning circuit 24. The external connection terminal may be provided with a Flexible Printed Circuit (FPC) 220 for inputting and outputting a signal.

First Application Example

Figure 9:
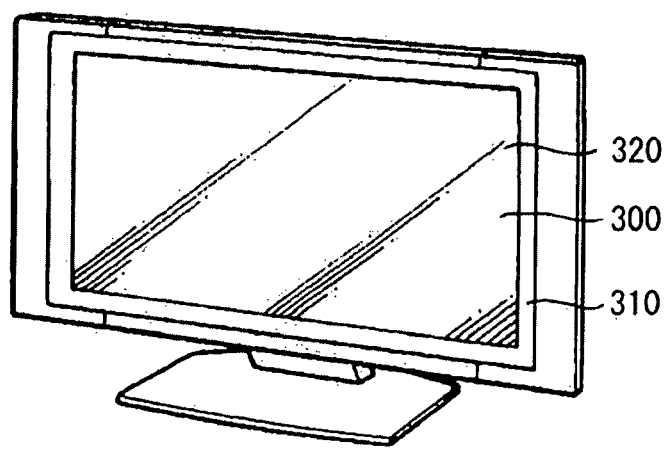
FIG. 9 is a perspective view illustrating an appearance of a first application example of the display unit of the foregoing embodiments.

FIG. 9 illustrates an appearance of a television device to which the display unit of the foregoing embodiments and the like is applied. The television device has, for example, a video display screen section 300 including a front panel 310 and a filter glass 320. The video display screen section 300 is composed of the display unit of the foregoing embodiments and the like.

Second Application Example

Figure 10A:
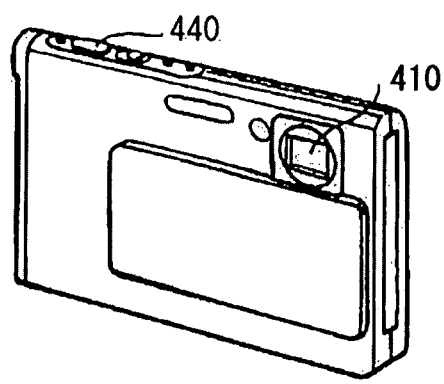
FIG. 10A is a perspective view illustrating an appearance viewed from the front side of a second application example.
Figure 10B:
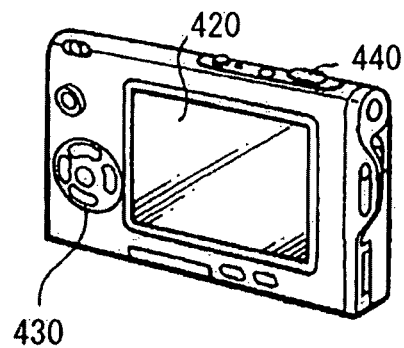
FIG. 10B is a perspective view illustrating an appearance viewed from the rear side of the second application example.

FIGS. 10A and 10B illustrate an appearance of a digital camera to which the display unit of the foregoing embodiments and the like is applied. The digital camera has, for example, a light emitting section for a flash 410, a display section 420, a menu switch 430, and a shutter button 440. The display section 420 is composed of the display unit according to the foregoing embodiments and the like.

Third Application Example

Figure 11:
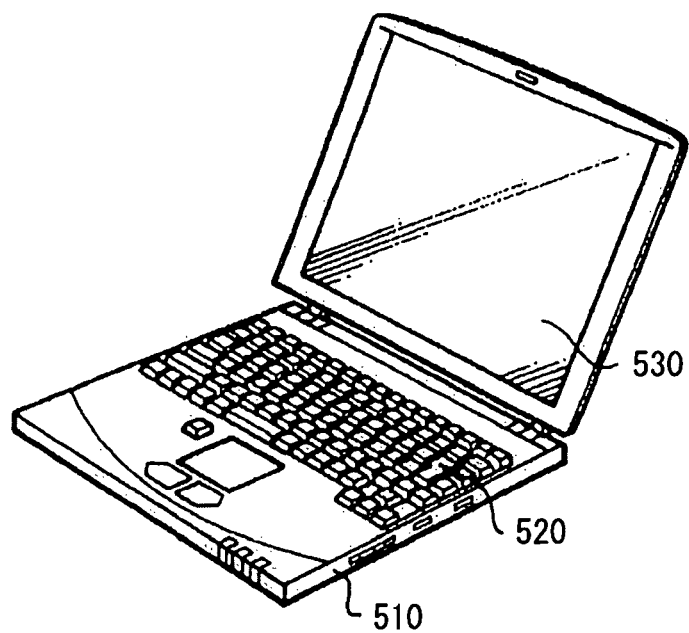
FIG. 11 is a perspective view illustrating an appearance of a third application example.

FIG. 11 illustrates an appearance of a notebook personal computer to which the display unit of the foregoing embodiments and the like is applied. The notebook personal computer has, for example, a main body 510, a keyboard 520 for operation of inputting characters and the like, and a display section 530 for displaying an image. The display section 530 is composed of the display unit according to the foregoing embodiments and the like.

Fourth Application Example

Figure 12:
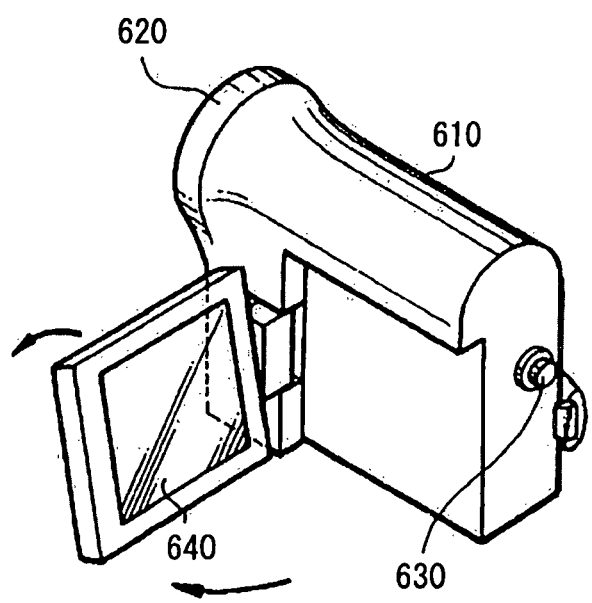
FIG. 12 is a perspective view illustrating an appearance of a fourth application example.
Figure 13:
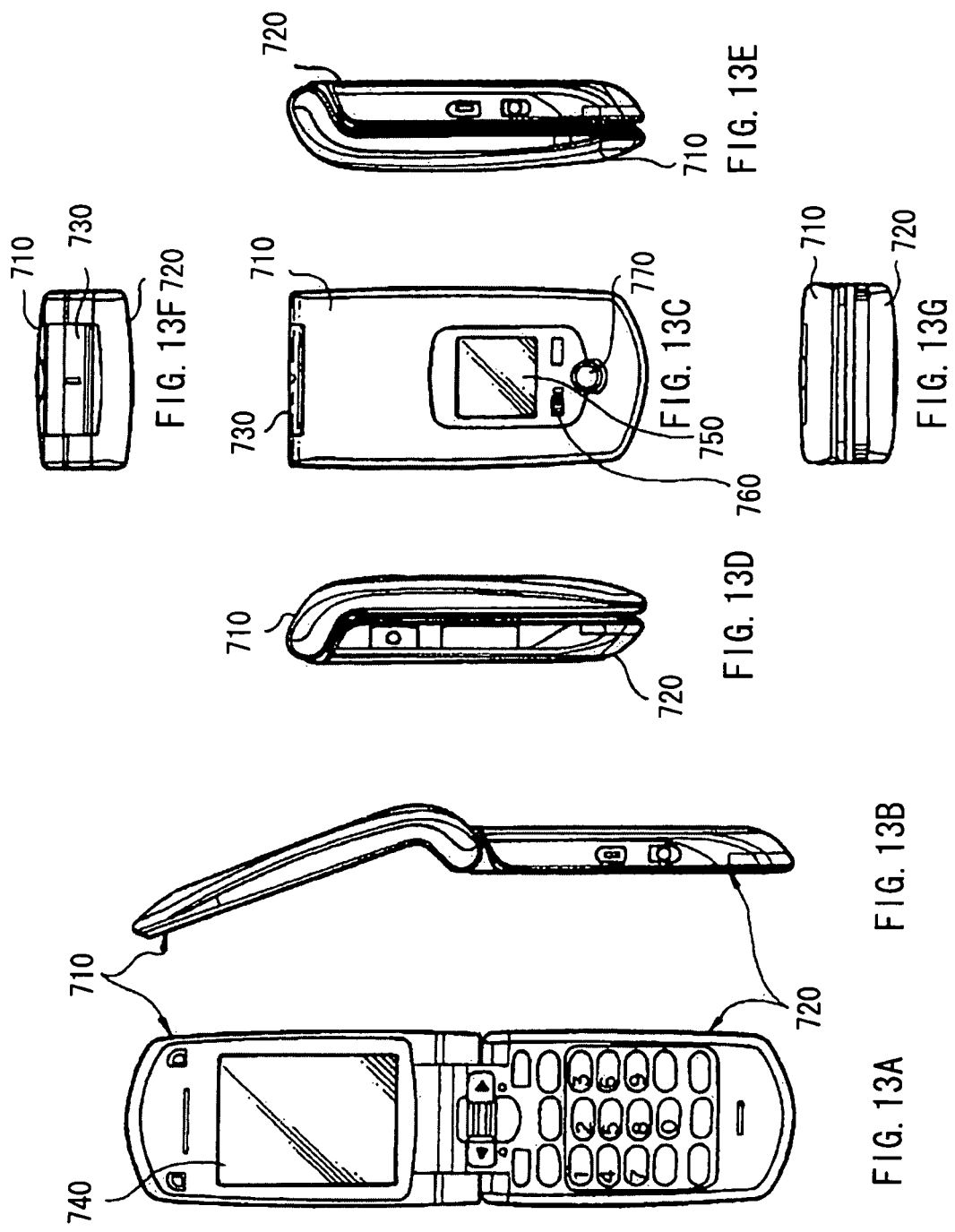
FIG. 13A is an elevation view of a fifth application example unclosed.
FIG. 13B is a side view thereof.
FIG. 13C is an elevation view of the fifth application example closed.
FIG. 13D is a left side view thereof.
FIG. 13E is a right side view thereof.
FIG. 13F is a top view thereof.
FIG. 13G is a bottom view thereof.
Figure 14:
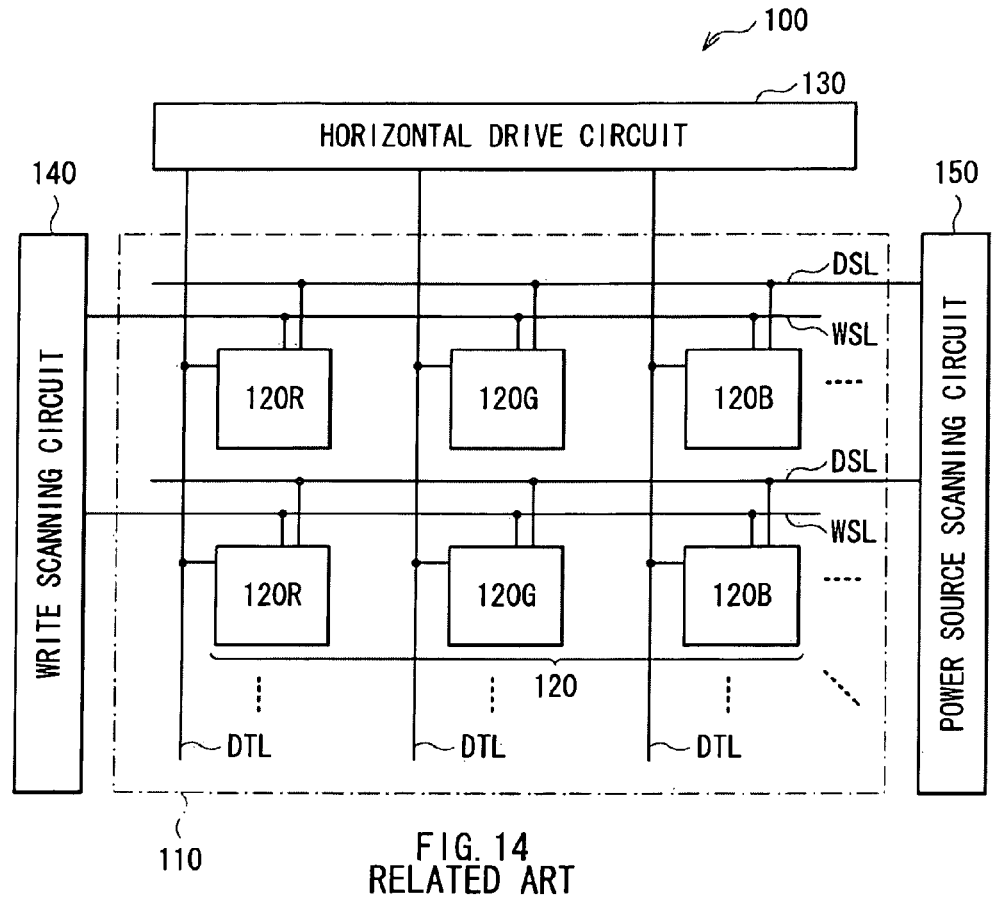
FIG. 14 is a schematic configuration view of an existing display unit.
Figure 15:
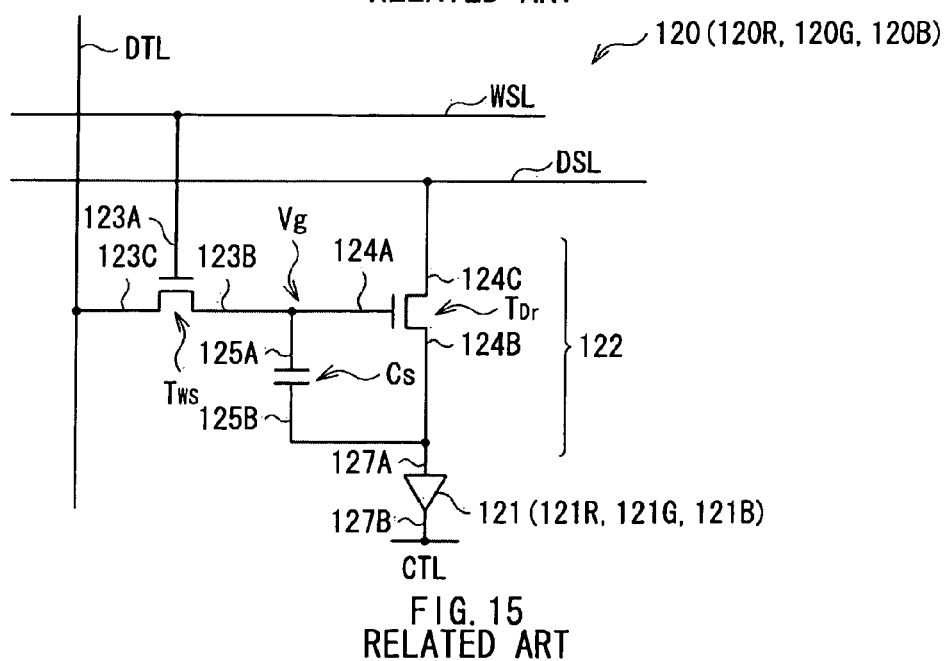
FIG. 15 is a circuit configuration diagram of the pixel of FIG. 14.

FIG. 12 illustrates an appearance of a video camera to which the display unit of the foregoing embodiments and the like is applied. The video camera has, for example, a main body 610, a lens for capturing an object 620 provided on the front side face of the main body 610, a start/stop switch in capturing 630, and a display section 640. The display section 640 is composed of the display unit according to the foregoing embodiments and the like.

Fifth Application Example

FIGS. 13A to 13G illustrate an appearance of a mobile phone to which the display unit of the foregoing embodiments and the like is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing embodiments and the like.

While the invention has been described with reference to the embodiments, the modified examples thereof, and the application examples, the invention is not limited to the foregoing embodiments and the like, and various modifications may be made.

For example, in the foregoing embodiments and the like, the description has been given of the case that the display unit is an active matrix type. However, the configuration of the pixel circuit 13 for driving the active matrix is not limited to the case described in the foregoing embodiments and the like, and a capacity device or a transistor may be added to the pixel circuit 13 according to needs. In this case, according to the change of the pixel circuit 13, a necessary drive circuit may be added in addition to the horizontal drive circuit 22, the write scanning circuit 23, and the power source scanning circuit 24 described above.

Further, in the foregoing embodiments and the like, driving of the horizontal drive circuit 22, the write scanning circuit 23, and the power source scanning circuit 24 is controlled by the signal retention control circuit 21B. However, other circuit may control driving of the horizontal drive circuit 22, the write scanning circuit 23, and the power source scanning circuit 24. Further, the horizontal drive circuit 22, the write scanning circuit 23, and the power source scanning circuit 24 may be controlled by a hardware (circuit) or may be controlled by software (program).

Further, in the foregoing embodiments and the like, the description has been given of the case that the source and the drain of the transistor $T_{ws}$ and the source and the drain of the transistor $T_{Dr}$ are fixed. However, it is needless to say that according to the flowing direction of current, opposing relation between the source and the drain may be opposite to that of the foregoing explanation.

Further, in the foregoing embodiments and the like, the description has been given of the case that the transistors $T_{ws}$ and $T_{Dr}$ are formed from the n channel MOS type TFT. However, it is possible that at least one of the transistors $T_{ws}$ and $T_{Dr}$ is formed from a p channel MOS type TFT. In the case where the transistor $T_{Dr}$ is formed from the p channel MOS type TFT, the anode 35A of the organic EL device 12 becomes a cathode and the cathode 35B of the organic EL device 12 becomes an anode in the foregoing embodiments and the like. Further, in the foregoing embodiments and the like, the transistors $T_{ws}$ and $T_{Dr}$ may be an amorphous silicon type TFT, or a low temperature polysilicon type TFT.

It should be understood by those skilled in the art that various modifications, combinations, sub-combinations and alternations may occur depending on design requirements and other factors insofar as they are within the scope of the appended claims or the equivalents thereof.

The invention claimed is:

1. A display unit comprising a display section having an organic EL device and a pixel circuit for every pixel,
wherein the pixel circuit has a first transistor for writing a video signal and a second transistor for driving the organic EL device based on the video signal written by the first transistor,
the second transistor has a gate, a source, and a drain,
the organic EL device has a first electrode, an organic layer, and a second electrode,
an upper face of the source or the drain is formed at least in a region opposed to the first electrode or the second electrode, and
wherein at least a part of the source or the drain has a curve shape.

2. The display unit according to claim 1, wherein the display section has a retentive capacity connected between the gate and the source or the drain for the every pixel, and
the retentive capacity is composed of the source or the drain in which the upper face is formed in the region opposed to the first electrode or the second electrode, and the gate.

3. A display unit comprising a display section having an organic EL device and a pixel circuit for every pixel,
wherein the pixel circuit has a first transistor for writing a video signal and a second transistor for driving the organic EL device based on the video signal written by the first transistor, the second transistor has a gate, a source, and a drain,
the organic EL device has a first electrode, an organic layer, and a second electrode, and
wherein at least a part of the source or the drain has a curve shape.

4. The display unit according to claim 3, wherein the source or the drain further has a short side portion including a continuous curved face.

* * * * *